United States Patent [19]

Benayoun et al.

[11] Patent Number: 5,771,262
[45] Date of Patent: Jun. 23, 1998

[54] IMPEDANCE ADAPTER FOR NETWORK COUPLER CABLE

[75] Inventors: Alain Benayoun, Cagnes Sur Mer; Jean-Francois Le Pennec, Nice; Patrick Michel, La Gaude; Henri Giuliano, Vence, all of France

[73] Assignee: International Business Machines Corporation, Armonk, N.Y.

[21] Appl. No.: 716,077

[22] Filed: Sep. 19, 1996

[30] Foreign Application Priority Data

Sep. 22, 1995 [EP] European Pat. Off. .............. 95480134

[51] Int. Cl.$^6$ ...................................................... H04B 3/00
[52] U.S. Cl. .......................... 375/257; 333/17.3; 333/32
[58] Field of Search ............................. 375/257; 326/30; 333/17.3, 32; 379/394, 398; 370/201

[56] References Cited

U.S. PATENT DOCUMENTS

| | | | |
|---|---|---|---|
| 5,057,783 | 10/1991 | Gubisch | 324/710 |
| 5,095,231 | 3/1992 | Sartori et al. | 326/30 |
| 5,424,692 | 6/1995 | McDonald | 333/32 |
| 5,459,440 | 10/1995 | Claridge et al. | 333/17.3 |
| 5,596,285 | 1/1997 | Marbot et al. | 326/30 |

OTHER PUBLICATIONS

IEEE International Solid State Circuits Conference, vol. 36, 1993 New York US, pp. 164–165, XP 000388065 Andre Dehon, "TP 10.7: Automatic Impedance Control".

Primary Examiner—Stephen Chin
Assistant Examiner—Betsy L. Deppe
Attorney, Agent, or Firm—Joscelyn G. Cockburn

[57] ABSTRACT

The invention provides an impedance adapter that automaticaly switches to impedances that match network transmit/receive lines impedances (105,106) by a controlled switching of various impedances mounted serially/parallely with connected transmitter/receiver (100,101). For a high speed adapter, a balanced transmitter/receiver is required for limiting crosstalk effect due to the high transmission rate. Transmit/Receive impedance adaptation networks (102–103) are composed of serial/parallel networks of resistors and relay contacts that are switched independently by magnetic coils of an impedance switching circuit (110) and having values conformable to the various network impedances imposed by different national regulations. By using the principle of double deviation voltage technique, a measuring circuit (108) detects upward and downward voltages (VA,VB), VB amplified by 2 to generate an analog signal VS (VS=VA−2VB) to a control logic circuit (109). This circuit (109) determines if the resistors value selected by the magnetic coils of said impedance switching circuit (110) is equal or not equal to the impedance of the network lines (106,105). Thus, it compares VS to a voltage Vref (25) to generate an output which selects and activates the correct magnetic coil for changing or keeping equal the resistors of the receive/transmit impedance network (102,103) currently connected to the network lines (105,106).

13 Claims, 6 Drawing Sheets

IMPEDANCE ADAPTER FOR NETWORK COUPLER CABLE

TECHNICAL FIELD IF THE INVENTION

The present invention relates to a data telecommunication system and more particularly to an impedance adapter using a network coupler cable for high speed data transmission for switching to the impedance of a connected network line.

BACKGROUND ART

There are many existing impedance adapters used in different technical fields, for instance, a radio frequency receiver system which is to be adapted to monitor the international radio-telegraph distress frequency.

In the telecommunication field in which there is a wide variety of impedances of telecommunication stages depending on country regulations. Each device that receives and transmits data from and to a telecommunication network operating according to its own internal impedance, is to be connected to an impedance adapter which switches to the right impedance in order to establish the best connection between the device and the network.

Impedance adaptation is an essential aspect of digital network design because impedance inconsistencies can result in data errors. A bad impedance adaptation may lead to noise or blank during the data transmission.

Generally speaking, for high speed adapters, this transmitter and receiver need to be balanced for limiting crosstalk effect due to the high transmission rate. This is particularly the case for an ISDN basic or Primary access, for T1 and E1 links. Customization of the adapter is then necessary to conform to national regulations which may require to such high speed.

To solve this problem, previous implementations consist in building dependent adapters with the corresponding impedance which is expensive in terms of manufacturing process or in adding to the adapter a way to configure the impedance. The configuration could either be done by the manufacturing which is also expensive or by the customer. But this latter solution is also of high cost since it implies that the configuring means should be accessible to the customer and easy to use. This generally increases the cost of the packaging solution.

In another technical field, a French patent application 80,05766 whose publication number is 2,478,412, discloses an impedance adapter for automatically adapting electronic circuits of a telephone set to the line resistor. This impedance adapter is dedicated to a switched vocal telephone network. In such network which uses a two-wire transmission line, splitting means is required to separate the reception line from the transmission line, this splitting means is called "antivocal system". This prior art illustrates the implementation of an improved antivocal system. In these switched telephone networks, the impedance is to be adapted to a unique line resistor fixed to 600 ohms, whereas for high speed data communication network above 2 megabits/s, the impedance of the transmission and reception systems are different and their values depends on the country regulations. The impedance differences spring from the types of transmission lines used by the local telecommunication authorities. For instance, the transmission lines used in UK are coaxed cables whose impedance is 75 ohms whereas in France the transmission lines are symmetrical torsaded pair whose impedance is 120 ohms. Consequently, the measuring circuit used in this prior art should be altered. Indeed, the one used in this prior art is adapted to a direct voltage generated by the telephone exchange to extract a direct current in order to determine a correspondent value of the line resistor. To each value of the line resistor, a program associates a set of pre-programmed parameters stored in a memory which allows to control the different variable elements such as the preamplifier gain of the microphone, the interrupter of antivocal system or the preamplifier gain of the listening post. When the network does not generate a direct voltage, this adapter cannot be used. Therefore, it is required to include in the adapter, means for providing a direct voltage which enables the measuring circuit to determine the value of the line impedance to which the adapter is connected and to switch the right impedance.

SUMMARY OF THE INVENTION

It is an object of the present invention to provide a unique impedance adapter to interface a plurality of impedances of the connected network lines.

It is also an object of the invention to provide an automatic detection of line impedance and an automatic switching of the adequate impedance in order to adapt respectively the transmitter and receiver to the network transmit and receive lines to which they are connected.

It is another object of the invention to use the transmitter stage of the data communication system for generating a controlled signal that can be measured and compared in order to determine the impedance value of the connected network lines.

Another object of the invention is to avoid customer switch setting during the installation and to avoid country dedicated adapter at the manufacturing site.

A further object of the invention is to provide an impedance adapter whose maintenance is simplified when changing a failing device, since no configuration action is required.

It is finally an object of the invention to provide an impedance adapter which may be used in a high speed adapters for T1 (1.5 Mbps), E1 (2 Mbps) links or for primary ISDN (2 Mbps) adapters.

The purpose of the present invention is to provide an impedance adapter that switches automatically to the serial impedance that matches the impedances of the network transmit and receive lines by a controlled switching of various impedances mounted in series with a transmitter and in parallel with a receiver to which they are connected.

The impedance adapter is to be implemented in a data telecommunication network using a network couple cable for adapting an impedance of a device attached thereto by the receiver and the transmitter to the impedance of network transmit and receive lines of a connected network among a number N of predetermined impedances. The impedance adapter according to the present invention comprises:

means for measuring a first signal VA of upward transmitter lines and a second signal VB of downward transmitter lines, and for amplifying said second signal VB by 2 in order to generate an output signal VS defined by VS=VA−2*VB;

means for comparing said output signal VS to a reference signal Vref and generating an "equal" signal or "not equal" signal in order to activate one of N control signals (Z1on, . . . , ZNon); and an impedance switching control comprising N magnetic coils responsive to said control signals (Z1on, . . . ZNon) for activating corresponding switches of a transmit and receive switching means to switch to the correct impedance.

The present impedance adapter may also be used for switching two impedances. In such case, the comparing means is responsive to said output signal VS and said reference signal Vref for activating control signals Z1on or Z2on through two magnetic coils in order to switch to a couple of corresponding transmit impedances of the transmit switching means and a corresponding receive impedance of the receive switching means.

BRIEF DESCRIPTION OF THE DRAWINGS

FIGS. 2-A and 2-B show in detail the impedance adapter according to the present invention for switching two impedances.

DESCRIPTION OF THE INVENTION

Figure 1:
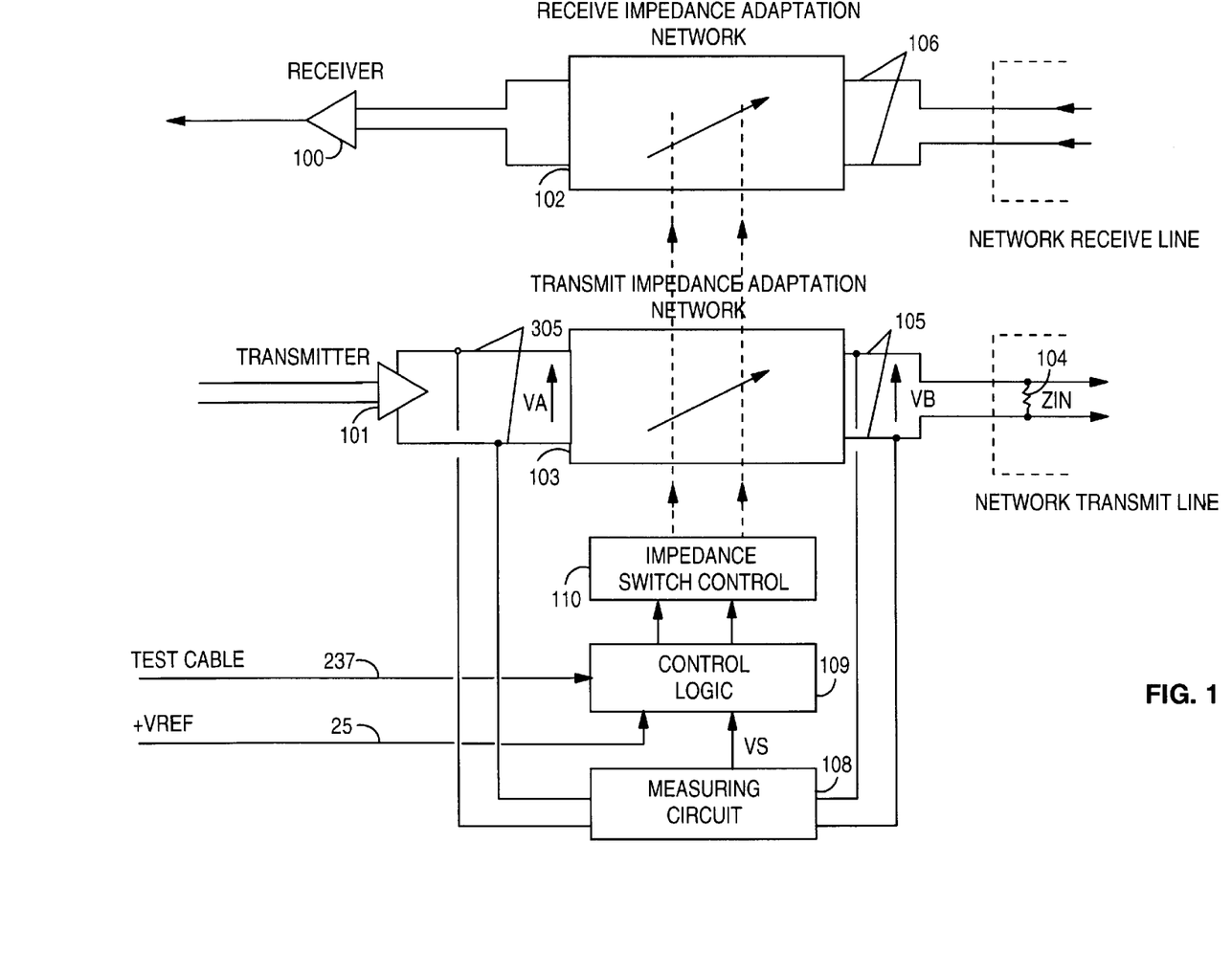
FIG. 1 represents an overview of the implementation according to the present invention.

The impedance adapter is preferrably composed of a receive/transmit impedance adaptation network (102,103), a measuring circuit (108), a control logic circuit (109) and an impedance switch control (110), as is shown in FIG. 1. It allows the connection between a receiver (100) and a network receive lines (106) through the receive impedance adaptation network (102). Conversely, it also allows the connection between a transmitter (101) and a network transmit lines (105) through a transmit adaptation network (103).

FIG. 1 illustrates an overview of the implementation of the present invention. A balanced receiver and transmitter (100,101) in normal operational mode receives and transmits data from and to a telecommunication line. Generally speaking, for high speed adapters, this driver needs to be balanced for limiting crosstalk effect due to the high transmission rate. This implementation is particularly adapted for T1, E1 links and for primary ISDN adapters.

The transmit impedance adaptation network (103) is connected between the transmitter (101) and the network transmit lines (105). It consists in a network of resistors and relay contacts that can be switched independently by magnetic coils of an impedance switching control (110) and having the values necessary for adapting its impedance to the various network impedance of the network transmit lines (105). Conversely, the receive impedance adaptation network (102) is connected between the receiver (100) and the network receive lines (106). It is composed of a network of resistors and relay contacts that can be switched independently by magnetic coils of the same impedance switching control (110) for adapting its impedance to the network receive lines (106).

The automatic impedance detection system is based on the use of the transmitter stage (101) to which is connected the transmit impedance adaptation network (103) and a measuring circuit (108). During the measuring operations, the data communication system configures the transmitter (101) in order to control its output signal VA for facilitating the measures. The measuring circuit (108) uses the principle of double voltage deviation technique, according to which when the impedance of the network transmit line (105) is equal to the transmit impedance adaptation network (103), the signal VA is equal to 2*VB. Therefore, the measuring circuit (108) detects an upward voltage VA of the impedance adapter and a downward voltage VB amplified by 2 in order to generate an analog signal VS (VS=VA−2VB) to a control logic circuit (109).

This control logic circuit (109) determines if the value of the resistors selected by the relays of said impedance switching control (110) is equal or not equal to the impedance of the network receive and transmit lines. For this purpose, it compares the voltage VS to a reference voltage Vref in order to generate a control signal which selects and activates the right magnetic coils of the impedance switching control for keeping or changing the resistors of the receive and transmit impedance adapatation networks (102,103) currently connected to the network lines.

Figure 2:
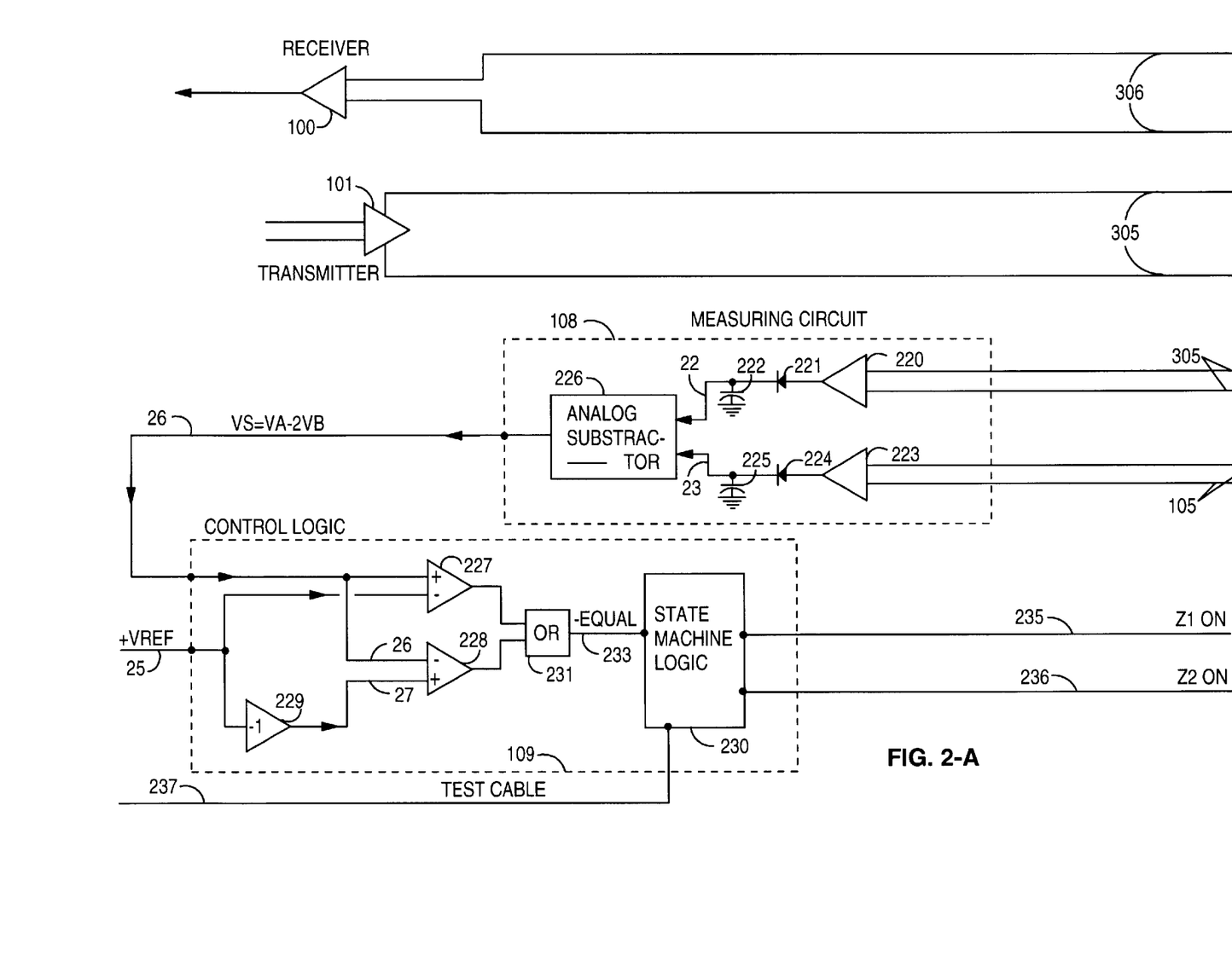

As is shown in FIGS. 2-A and 2-B, the transmit impedance adaptation network (103) comprises two couples (pairs) of impedances (205,206) and (209,210) with each impedance respectively connected in series to two couples of relay contacts (207,208) and (211,212). The first couple of impedances and relay contacts (205,207,206,208) are parallely mounted and connected to a first line (305) of the transmitter (101). In the same way, the second couple of impedances and relay contacts (209,211,210,212) are parallely mounted and connected to a second line (305) of the transmitter (101). The relays contacts (207,208,211,212) are controlled by the control logic circuit (109) through magnetic coils (310,320) of the impedance control switching circuit (110).

The control logic (109) comprises a state machine (230) which activates the relay contacts (207,208,211,212) according to its input signal "−Equal" (233). This signal (233) is received from a two-input OR gate (231), each input is connected to an output of 2 comparators (227,228). These comparators respectively compare the signal Vs (26) received from an analog substractor (226) to a reference signal Vref (25) locally generated. The signal Vs (26) is connected to a positive input of the first comparator (227) while its negative input is connected to the reference voltage Vref (25). The signal Vs is also connected to a negative input of the second comparator (228) while its positive input is connected to the reference voltage Vref inverted by the invertor (229) of a gain 1.

In the measuring circuit (108), the analog substractor (226) substracts two analog signals presented on its entries which are the output VA of a transmitter amplified by an amplifier (220) by 1, rectified by a diode (221) and filtered by a capacitor (222), and the output VB of the network transmit line amplified by 2 in an amplifier (223), rectified by a diode (224) and filtered by a capacitor (225). The output VA is the voltage measured between the upward lines (305) of the transmitter stage, whereas the output VB is the voltage measured downward. Both lines (305) are connected to the inputs of amplifier (220) whose output is connected to diode (221) which generates a signal to capacitor (222). Conversely, both lines (105) are connected to the inputs of amplifier (223) whose output is connected to diode (224) which generates a signal to capacitor (225). The purpose of these rectifying and filtering operations is to average the analog signals present on the network transmit line.

The receive impedance adaptation network (102) comprises parallel impedances (204,202) which are connected in series to relay contacts (203,201) which are also controlled by the control logic circuit (109) respectively through magnetic coils (310,320).

The network transmit line (105) is based on a couple of wires which behave like a transmission line which has a first and a second end. Said first end is connected to the impedance adapter and has an input impedance Zin (104). The second end has a resistor equal to the value of the characteristic impedance Zc and is connected to another circuit. This transmission line is then terminated by this characteristic impedance Zc in order to avoid a reflection of electrical signals. The impedance of the transmitter (101) shall be equal to the characteristic impedance Zc to obtain a transmission line perfectly adapted on both ends.

Consequently, as is previously said, the network transmit line (105) is perfectly adapted when the serial resistors ZT of the transmit impedance adaptation network (103) is equal to the input impedance Zin of the network transmit line. This also applies to the network receive line (106).

When the serial resistors ZT and the impedance Zin are equal, the serial resistors ZT and the input impedance Zin of the network transmit line (105) behaves like a voltage divider by 2. As a consequence the following relation is obtained VB=VA/2.

Since the analog substractor makes the substraction between VA (averaged by the rectifying and filtering operations) and the signal VB amplifed by 2 (also averaged by the rectifying and filtering operations), the analog substractor (226) generates a signal VS (VS=VA−2VB) equal to zero.

The analysis method of the transmit line impedance aims to obtain this signal VS equal to zero by switching the various serial impedances of the transmit impedance adaptation network (103) to the right impedance of the network transmit line.

By the same time, a corresponding impedance of the receive impedance adaptation network (102) is switched by the same impedance switching control circuit (110) in order to be adapted to the impedance of the network receive line.

The functional description of FIGS. 2-A and 2-B is as follows:

When the adapter is activated, a test cable signal (237) is activated and resets the control logic machine (230). The reset of the adapter implies the opening of the relay contacts except those that connect serial resistors (205,209) referred as ZT on the transmit side and resistor (204) referred as ZR on the receive side.

At the beginning of the measuring period, an impedance ZT is connected in series with the transmitter (101) and an impedance ZR is connected in parallel with the receiver (100). The transmitter (101) generates a balanced signal on two leads (305). In telecommunication high speed adaptor, this signal is generally taken as a binary continuous signal coded according to the type of the coding used by the transmitter in normal transmission mode. This results in an analog periodic continuous signal. This signal goes through the impedance ZT (205,209), the relay contacts (207,211) and both wires of the network transmit line (105).

After a stabilization period, the balanced signals (305) are monitored with a high impedance buffer amplifier (220) set with a gain equal to 1 whose output is rectified by the diode (221) and filtered by the capacitor (222) before being connected to a first input (22) of the analog substractor (226), the voltage of this first input is approximatively equal to VA. On another side, the balanced signals of the network transmit line (105) are monitored with a high impedance buffer amplifier (223) set with a gain equal to 2 whose output is rectified by the diode (224) and filtered by the capacitor (225) before being connected to a second input (23) of the analog substractor (226), the voltage of this second input is approximatively equal to 2*VB.

Both wires of the network transmit line can be modelized as an input impedance Zin. Thus, the signal existing on both wires is the resulting signal coming from the transmitter (101) and divided by a voltage divider composed of series resistors R1 and R2 (205,209) and Zin, which gives then the formula VB=VA*Zin/(Zin+R1+R2).

Since the output VS (26) of the analog substractor is ruled by the following formula: Vs=VA−2VB, three cases may occur:

When the switched serial impedance (R1+R2) is greater than the input impedance Zin, the voltage VS is greater than 0 Volt, which gives:

When (R1+R2)>Zin, then Zin/(Zin+R1+R2)<(½), then VS>0. In such case, the state of the two inputs of the first comparator (227) is such that the voltage on its positive input is greater than the voltage on its negative input receiving Vref being positive and slightly different from 0 volt, consequently its output is positive; whereas the voltage of the negative input of the second comparator (228) is greater than the voltage on its positive input receiving −Vref, then its output is negative. In this first case, lead 233 is set to 1, which means that it is a "not equal" signal, and the state machine (230) activates a control signal corresponding to another (higher or lower) impedance.

When the switched serial impedance (R1+R2) is smaller than the input impedance Zin, the voltage VS is lower than 0 Volt, which gives:

When (R1+R2)<Zin, then Zin/(Zin+R1+R2)>(½), then VS<0. In such case, the state of the two inputs of the first comparator (227) is such that the voltage on its positive input is lower than the voltage on its negative input Vref, then the output of the comparator (227) is negative, whereas the voltage on the negative input of the second comparator (228) is lower than the voltage on its positive input −Vref, then its output is positive. In this second case, lead 233 is set to 1, which means that it is a "not equal" signal, and the state machine (230) activates a control signal corresponding to another (lower or higher) impedance.

When the switched serial impedance (R1+R2) is equal to the input impedance Zin, the voltage VS is equal to 0 Volt, which gives:

When (R1+R2) =Zin, then Zin/(Zin+R1+R2)=(½), then VS=0. In this case, the state of the two inputs of the first comparator (227) is such that the voltage on its positive input is 0 Volt and the negative input of the comparator is Vref which is taken positive and slightly different from 0 volt, then the output of the comparator (227) is negative; whereas, the voltage on the negative input of the second comparator (228) is 0 Volt and the positive input of the comparator is equal to −Vref, then its output is negative. In this third case, since the two inputs of the OR gate are negative, its output is set to 0, which means that it is an "equal" signal and the state machine (230) is kept unchanged.

Figure 3:
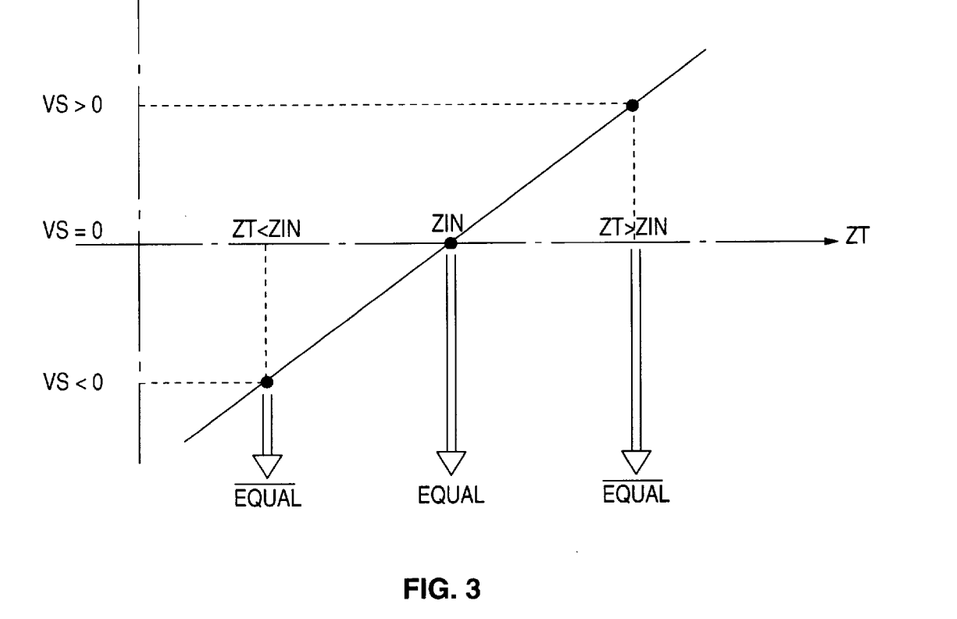
FIG. 3 shows a graphic variation of voltage VS according to the serial resistors ZT of the transmit impedance adaptation network.

The purpose of Vref is now discussed by referring to FIG. 3. If the serial resistors ZT is equal to the impedance Zin, the voltage on Vs is equal to 0 volt. Then the voltage on the second inputs (25,27) of the two comparators (227,228) is to be fixed to a level slightly different from 0 volt, this in order to fix a stable state of the comparators. This case occurs when the length of the network transmit line (105) is short and the input impedance Zin is equal to the load impedance which is on the other end of the network transmit line (105). But when the length of the transmit line is important, the input impedance Zin measured on the transmit line will not exactly be equal to its load impedance. Thus, if the serial resistors switched on the transmitter match, the voltage divider will not lead to a perfect 0 volt but to potential voltage slightly different from 0 volt. In this case, the adapter shall accept that the potential Vs is never found equal to 0 volt, and a margin of error needs to be implemented. The level of Vref can be obtained by simulating transmit lines of different lengths according to the primary parameters as lineic resistance, capacitance, inductance and conductance that are given by the telecommunication carrier.

Figure 4:
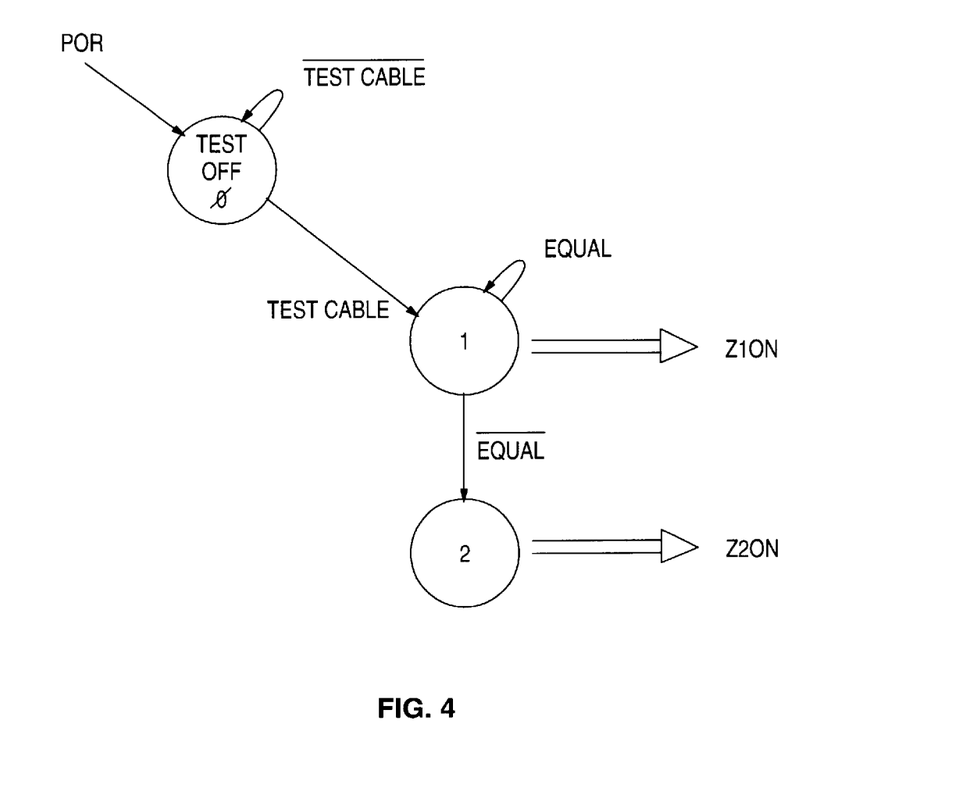
FIG. 4 illustrates a functional description of a corresponding state machine for switching two impedances.

The function of the finite state machine (230) when two impedances is to be switched is shown in FIG. 4. At power on reset, the state machine is reset to state 0. This state is called "test off". When it receives a test cable signal (237), it goes to state 1 which is decoded to set a signal Zion (235) which corresponds to the first impedance Z1 composed of resistors R1 and R2 (205,209) on the transmit side and resistor R5 (204) on the receive side. When this test cable signal is activated, it enables the switching of the relay contacts (211,207,203) through a relay (310) of the impedance switching control circuit (110). This switching modifies the voltage VB. After a stabilization period, the control logic (109) analyses the value of VS=VA–2VB which influences the inputs of the state machine (230). According to this value, two cases may occur. Firstly, the –equal signal (233) is on, then the state machine remains at state 1 until a next power on reset. Secondly, the –equal signal (233) is on, then the state machine goes to state 2 and sets a signal Z2on (236) which corresponds to the second impedance Z2 composed of resistors R3 and R4 (206,210) on the transmit side and resistor R6 (202) on the receive side, and by the way, resets the Z1on signal (235). When this Z2on signal is activated it enables the switching of the relay contacts (208,212,201) through a relay (320) of the impedance switching control circuit (110). This switching modifies the voltage VB. After a stabilization period, the control logic (109) analyses the status of the four inputs of the state machine (230). The signal –equal (233) should be found on. The state machine remains at this state 2 until a next power on reset.

It is to be noticed that the adaptation is made simultaneously on both transmit and receive sides by either resistors couple R1,R2 (205,209) or R3,R4 (206,210) on the transmit side and resistor R5 (204) or R6 (202) on the receive side.

For the switching of two impedances, no matter the first impedance Z1 is higher or lower than the second impedance Z2. But if the impedance adapter is dedicated to N impedances, it is necessary to arrange the N impedances according to an increasing or decreasing order.

Figure 5:
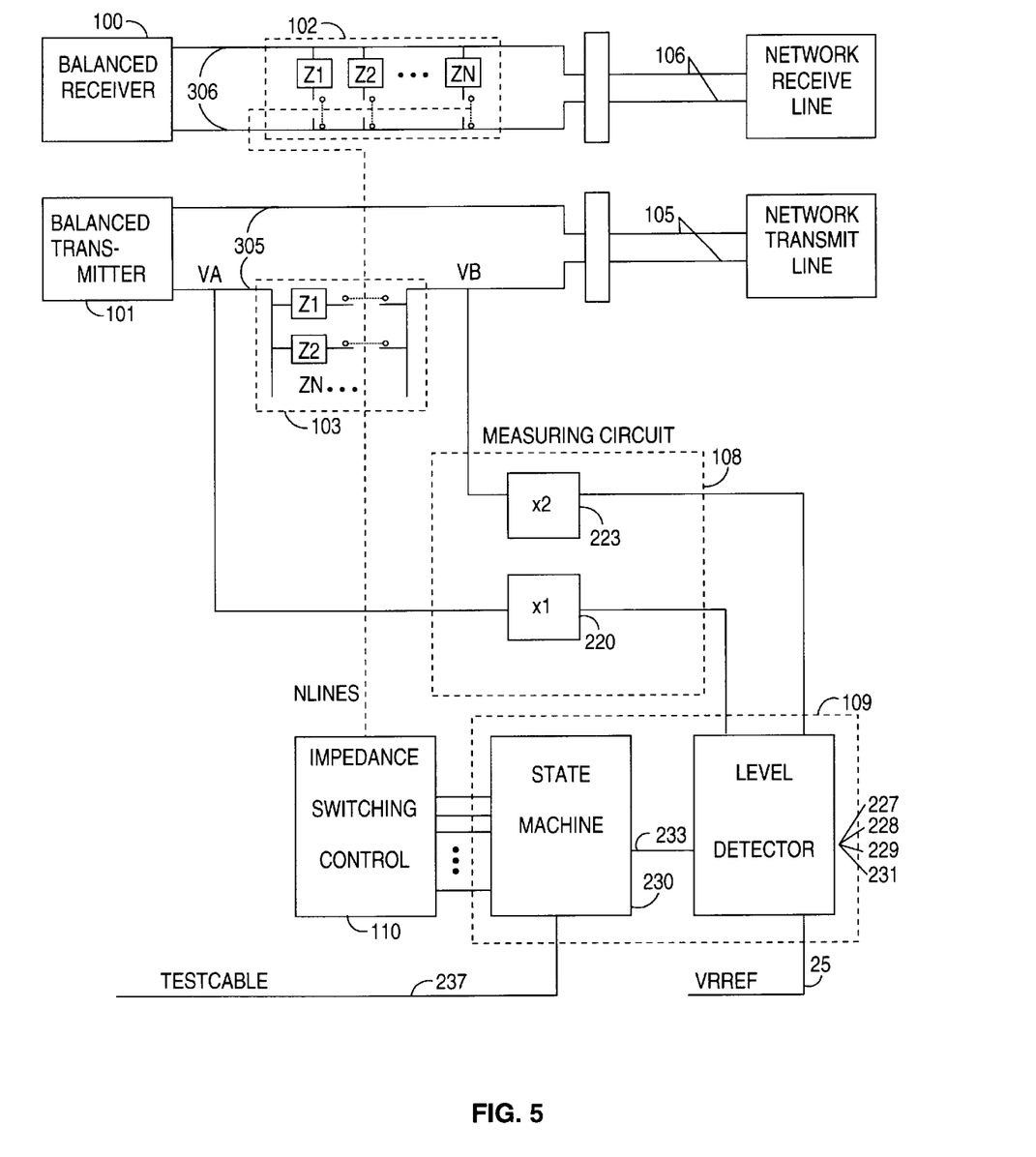
FIG. 5 represents the implementation of the impedance adapter for switching N impedances.
Figure 6:
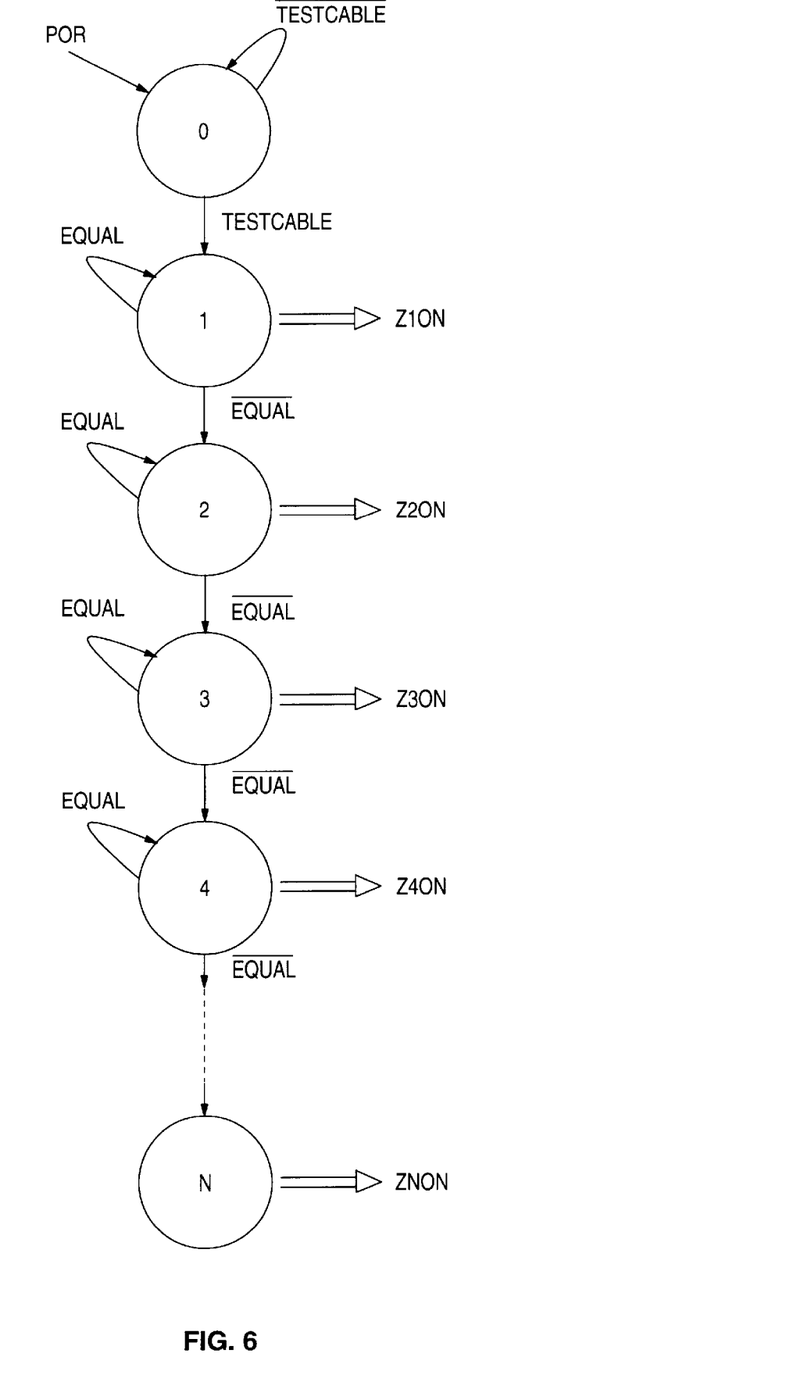
FIG. 6 shows a functional description of a corresponding state machine for switching N impedances.

FIG. 5 generalizes the implementation of the impedance adapter according to the present invention to N impedances which can be switched on the transmit side as on the receive side. To improve the readability of the schematics, the balanced transmit impedance adaptation network (103) has been modelized in a non-balanced one. The other circuits such as the measuring circuit (108) and the control logic circuit (109) excluding the logic state machine, are identical to what is described above for the case of two impedances. The impedance switching control circuit (110) is composed of as many relays as impedances to switch. As an example for the adaptation of N different impedances, N relays are needed. In the same way, the state machine (230) which receives the –equal input (233) from a level detector composed of components (227,228,229,231) has N outputs (Z1on to ZNon) to control the N relays of the impedance switching control. The N impedances Z1 to ZN of the transmit impedance adaptation network (103) are to be arranged according to an increasing or decreasing order. The receive impedance adaptation network (102) is composed of N parallel resistors switchable by N relays contacts which are also controlled by the N relays of the impedance switching control (110). FIG. 6 shows the finite state machine (230) generalized for N impedances. Two options can be faced either Z1 is the smallest impedance (Z1<Z2<<ZN) or Z1 is the highest impedance and (Z1>Z2>>ZN). After power on reset, the state machine is initialized to state 0 and waits for the activation of the test cable signal (237). When the test cable is set, the state machine goes to state 1. Zion is activated and a first cycle of measure and comparison is performed. Two cases may occur: if the "equal" signal is activated the state machine remains at state 1, otherwise, the finite state machine moves to state 2 and a new cycle of measure and comparison is started, and according to the "equal" signal or "not equal" signal, the state machine remains at state 2 or goes to state 3. And this is repeated up to state N but stops when an equal signal is activated.

The state machine remains at the state where the "equal" signal is activated until the next power on reset. It is to be noticed that the "not equal", signal means that the impedance is to increase or decrease according to how the N predetermined impedances are arranged in an increasing or decreasing order.

We claim:

1. An apparatus in a data telecommunication network using a network couple cable for adapting an impedance of a device attached thereto by a receiver (100) and a transmitter (101) to the impedance of network transmitter and receiver lines (105,106) of a connected network among a number N of predetermined impedances; said apparatus characterized in that it comprises:

means (108) for measuring a first signal VA of upward transmitter lines (305) and a second signal VB of downward transmitter lines (105), and for amplifying said second signal VB by 2 in order to generate an output signal VS (26) defined by VS=VA–2*VB;

means (109) for comparing said output signal VS (26) to a reference signal Vref (25) and generating an "equal" signal or "not equal" signal in order to activate one of N control signals (Z1on, . . . , ZNon); and an impedance switching control (110) comprising N magnetic coils responsive to said control signals (Z1on, . . . ZNon) for activating corresponding switches of a transmit and receive switching means (102,103) to switch to the correct impedance.

2. The apparatus according to claim 1 wherein said measuring means comprises:

means (221,224) for respectively rectifying said upward VA and downward 2*VB signals;

means (222,225) for respectively filtering the rectified signals generated by said rectifying means (221,224); and an onolog substractor (226) for receiving said filtered signals and generating said output signal VS (26).

3. The apparatus according to any one of the previous claims wherein said comparing means (109) comprises:

a first comparator (227) comparing said output signal VS (26) on its positive input to said reference signal Vref (25) on its negative input for generating a negative or positive output signals;

a second comparator (228) responsive to said output signal VS (26) on its negative input and to said reference signal Vref (25) inverted by an inverter (229) on its positive input for generating a negative or positive output signals;

a two-input OR gate (231) receiving said negative or positive output signals from both comparators (227, 228) and generating said "−equal" or said "+not equal" signal (233); and a controlling means (230) responsive to said "+not equal" signal or, "−equal" signal to activate one of said N control signals (Z1on, Z2on or ZNon).

4. The apparatus according to claim 3 wherein the controlling means (230) comprising N+1 states and whose state 0 corresponds to a power on reset and whose state 1 to N correspond to the activation of said N control signals (Z1on, Z2on, . . . , ZNon).

5. The apparatus according to claim 1 wherein:

the receive switching means (102) comprises N parallel impedances (202 . . . 204), each one being associated with a relay contact (201 . . . 203) that is controlled by said comparing means (109) through said impedance switching control (110); and the transmit switching means (103) comprises two sets of N impedances ((205 . . . 206), (209 . . . 210)), wherein each impedance ((205 . . . 206), (209 . . . 210)) is connected to a relay contact ((207 . . . 208), (211 . . . 212)) that is controlled by said comparing means (109) through said impedances switching control (110).

6. An apparatus for adapting an impedance of a device attached thereto by a receiver and a transmitter to the impedance of network transmitter lines and network receiver lines including:

a receive impedance adaptation network positioned within said network receiver lines;

a transmit adaptation network positioned within said network transmit lines;

an impedance switching control circuit coupled to the receive impedance adaptation network and the transmit adaptation network;

measuring circuit for measuring a first signal upstream the transmit adaptation network, a second signal downstream the transmission adaptation network and correlating said first signal and said second signal to generate an Output signal, (VS); and a control logic circuit being responsive to the Output signal and a reference signal to generate at least one control signal for causing the impedance switching control circuit to switch correct impedances into the receive and transmit lines.

7. The apparatus of claim 6 wherein the first signal and the second signal are being correlated in accordance with the mathematical expression VS=VA−2VB, wherein VA represents the first signal upstream the transmit adaptation network and VB represents the second signal downstream the transmit adaptation network.

8. The apparatus of claim 6 wherein the receive impedance adaptation network includes at least two impedances coupled in parallel to the network receiver lines.

9. The apparatus of claim 6 wherein the transmit impedance adaptation network includes at least two sets of impedances coupled to the network transmit lines.

10. The apparatus set forth in claim 8 or claim 9 wherein the impedance switching control circuit includes at least two switching relays with inputs for receiving independent drive signals.

11. The apparatus set forth in claim 10 wherein the measuring circuit includes an analog subtractor with an output signal terminal and two signal inputs and a series coupled buffer amplifier, rectifier and capacitor connected to each input of said analog subtractor.

12. The apparatus of claim 11 wherein the control logic circuit includes a level detector with an input coupled to the output signal terminal and a state machine with at least one input coupled to the level detector and outputs coupled to the impedance switching control circuit.

13. A method for adapting impedance of a device to the impedances of network receive transmission lines and network transmit transmission lines comprising the steps of:

coupling a receive impedance adaptation network in the receive transmission lines;

coupling a transmit impedance adaptation network in the transmit transmission lines;

generating a signal VS from the mathematical expression VS=VA−2VB, wherein VA and VB are voltages measured at selected points of the transmit transmission lines;

correlating the VS with a reference signal to generate at least one control signal that causes select impedances in the receive impedance adaptation network and transmit impedance adaption network to switch into the receive and transmit transmission lines.

* * * * *